(12) United States Patent
Hutton et al.

(10) Patent No.: US 9,705,506 B2
(45) Date of Patent: *Jul. 11, 2017

(54) FIELD PROGRAMMABLE GATE ARRAY WITH INTEGRATED APPLICATION SPECIFIC INTEGRATED CIRCUIT FABRIC

(75) Inventors: Michael D. Hutton, Mountain View, CA (US); James G. Schleicher, II, Los Gatos, CA (US); Daniel R. Mansur, Emerald Hills, CA (US)

(73) Assignee: ALTERA CORPORATION, San Jose, CA (US)

( * ) Notice: Subject to any disclaimer, the term of this patent is extended or adjusted under 35 U.S.C. 154(b) by 368 days.

This patent is subject to a terminal disclaimer.

(21) Appl. No.: 13/613,925

(22) Filed: Sep. 13, 2012

(65) Prior Publication Data

US 2013/0009666 A1 Jan. 10, 2013

Related U.S. Application Data

(60) Continuation of application No. 12/767,696, filed on Apr. 26, 2010, now Pat. No. 8,314,636, which is a division of application No. 11/894,283, filed on Aug. 20, 2007, now Pat. No. 7,724,032.

(51) Int. Cl.
*H03K 19/177* (2006.01)

(52) U.S. Cl.
CPC . *H03K 19/17744* (2013.01); *H03K 19/17732* (2013.01); *H03K 19/17796* (2013.01)

(58) Field of Classification Search
CPC ....... H03K 19/17732; H03K 19/17748; H03K 19/17744; H03K 19/17796; H03K 19/17724; H03K 19/17736; H03K 19/17756

USPC ................. 326/37–41, 47; 716/128
See application file for complete search history.

(56) References Cited

U.S. PATENT DOCUMENTS

| | | | |
|---|---|---|---|
| 5,942,913 A * | 8/1999 | Young | H03K 19/17736 326/39 |
| 6,020,755 A * | 2/2000 | Andrews | H03K 19/17732 326/39 |
| 6,754,130 B1 * | 6/2004 | Carter | 365/230.05 |
| 6,944,836 B1 * | 9/2005 | Lai | 716/136 |
| 7,038,490 B1 * | 5/2006 | Singh | G06F 17/505 257/E27.105 |
| 7,187,199 B1 | 3/2007 | Lai | |
| 7,308,630 B2 * | 12/2007 | Grupp et al. | 714/725 |

(Continued)

*Primary Examiner* — Alexander H Taningco
*Assistant Examiner* — Nelson Correa
(74) *Attorney, Agent, or Firm* — Fletcher Yoder P.C.

(57) ABSTRACT

A field programmable gate array ("FPGA") is provided having integrated application specific integrated circuit ("ASIC") fabric. The ASIC fabric may be used to implement one or more custom or semi-custom hard blocks within the FPGA. The ASIC fabric can be made up of a "custom region" and an "interface region." The custom region can implement the custom or semi-custom ASIC design and the interface region can integrate and connect the custom region to the rest of the FPGA circuitry. The custom region may be based on a structured ASIC design. The interface region may allow the ASIC fabric to be incorporated within the hierarchical organization of the FPGA, allowing the custom region to connect to the FPGA circuitry in a seamless manner.

18 Claims, 5 Drawing Sheets

(56) References Cited

U.S. PATENT DOCUMENTS

| | | | |
|---|---|---|---|
| 7,334,208 B1 * | 2/2008 | Cox | G06F 17/5081 |
| | | | 716/129 |
| 7,373,630 B1 * | 5/2008 | Yuan | G06F 17/5045 |
| | | | 716/103 |
| 7,378,874 B2 * | 5/2008 | Bharath | H03K 19/177 |
| | | | 326/101 |
| 7,389,487 B1 * | 6/2008 | Chan | G06F 15/7867 |
| | | | 716/121 |
| 7,406,668 B1 * | 7/2008 | Pedersen | G06F 17/5054 |
| | | | 716/103 |
| 7,420,392 B2 * | 9/2008 | Schultz | G06F 15/7867 |
| | | | 326/101 |
| 7,426,708 B2 * | 9/2008 | Koo | G06F 11/20 |
| | | | 714/E11.071 |
| 7,493,511 B1 * | 2/2009 | Yin et al. | 713/600 |
| 7,724,032 B2 * | 5/2010 | Hutton | H03K 19/17732 |
| | | | 326/41 |
| 7,734,968 B2 * | 6/2010 | Grupp et al. | 714/724 |
| 8,314,636 B2 * | 11/2012 | Hutton | H03K 19/17732 |
| | | | 326/101 |
| 2003/0229837 A1 * | 12/2003 | Cox | 714/737 |
| 2006/0190903 A1 * | 8/2006 | Koo | 716/16 |
| 2008/0054939 A1 * | 3/2008 | Bharath et al. | 326/41 |

* cited by examiner

FIELD PROGRAMMABLE GATE ARRAY WITH INTEGRATED APPLICATION SPECIFIC INTEGRATED CIRCUIT FABRIC

CROSS-REFERENCE TO RELATED APPLICATIONS

This application is a continuation of pending U.S. patent application Ser. No. 12/767,696, filed Apr. 26, 2010, which is a division of U.S. patent application Ser. No. 11/894,283, filed Aug. 20, 2007 (now U.S. Pat. No. 7,724,032), each of which is hereby incorporated by reference herein in its entirety.

BACKGROUND OF THE INVENTION

This invention relates to field programmable gate arrays ("FPGAs"), and more particularly to FPGAs having integrated application specific integrated circuit ("ASIC") fabric.

A FPGA may include a large number of relatively small modules of programmable logic. For example, each such logic module ("LM") or logic element ("LE") may include a four-input look-up table ("LUT"), a register (e.g., for selectively registering an output signal of the LUT), and a small amount of other circuitry (e.g., for determining whether and how the register is used, for selecting control signals for the register, etc.). The LUT may be programmable to produce an output signal that is any logical combination or function of the four inputs to the LUT. The LE may be programmable with respect to whether and how the register is used, and what control signals (e.g., clock, clock enable, clear, etc.) are selected for application to the register.

In addition to the LEs, a FPGA typically includes programmable interconnection circuitry for conveying signals to, from, and/or between the LEs in any of many different ways. This allows the relatively simple logic capabilities of individual LEs to be concatenated to perform logic tasks of considerable complexity.

It has been found helpful and economical to give the resources in FPGAs—especially large FPGAs—a hierarchical organization. For example, the LEs in a FPGA may be clustered in groups that may be called logic array blocks or LABs. The LEs in a LAB share certain resources associated with the LAB. These shared resources may include such things as LAB input multiplexers ("LIMs"), and LE input multiplexers ("LEIMs") circuitry, which are programmable to select signals from nearby interconnection conductors so that those signals will be available as inputs to the LABs and LEs.

It has become increasingly standard in FPGA architectures to add dedicated or "hard" blocks amongst to programmable logic to add common functionality to the FPGA. The first hard blocks added to FPGAs were embedded memory. Later microprocessors and hard multipliers or digital signal processing ("DSP") blocks were added. Other hard blocks have been considered such as crossbars or barrel shifters, and floating-point units ("FPU"), but have been rejected based on cost-benefit analyses. In general these blocks can be either full custom, standard cell, or semi-custom implementations. These hard blocks can be added to a FPGA either to make a dramatic shrink in the size of a function or to improve performance of a speed-critical block. DSP blocks, for example, achieve both. A further attraction of hard blocks is that the fixed implementation provides the benefit of a consistent implementation, reducing the effort of timing closure.

One of the main properties of hard blocks is that they tend to get dramatic benefits when used. However, it is rare that all the hard blocks are used and often these hard blocks are not used at all. This has also lead to the creation of entire families of FPGAs having, for example, "IO-rich," "LE-rich," "memory-rich," and "DSP-rich" parts in order to satisfy diverse customer needs. For example, an "LE-rich" device may have one DSP column for every 10 LAB columns, while a DSP-rich device may have one DSP column every 6 LAB columns.

Some of the major hurdles in adding hard blocks to FPGAs are that: hard blocks that are a great advantage for some is just an area waste for others, it is not cost-efficient to make a family of FPGAs with too many different members and variations, and often it is not known until long after the device is defined which hard blocks should be included in a design.

SUMMARY OF THE INVENTION

In accordance with the invention an FPGA is provided having integrated ASIC fabric. The ASIC fabric may be used to implement one or more custom or semi-custom hard blocks within the FPGA. The ASIC fabric can be made up of a "custom region" and an "interface region." The custom region can implement the custom or semi-custom ASIC design and the interface region can integrate and connect the custom region to the rest of the FPGA circuitry.

The custom region can be based on a structured ASIC design, in which the logic mask-layers of the ASIC are predefined and design differentiation and customization can be achieved by creating custom metal layers that create custom connections between predefined lower-layer logic elements. Because only a small number of metal layers must be custom-produced, custom designs for the custom region can be produced cheaply and easily. Further, having logic elements that are the same as or similar to the LEs within the FPGA fabric, makes it easy to incorporate the structured ASIC region within the FPGA.

The interface region allows the ASIC fabric to be incorporated within the hierarchical organization of the FPGA, allowing the custom region to connect to the FPGA circuitry in a seamless manner. For example, the interface region may include the same or similar connections to the FPGA routing lines and neighboring LABs and LEs as any other LAB or hard block within the FPGA. The interface region can also include freeze logic that can "freeze" the inputs and/or outputs of the custom region during configuration of the FPGA fabric.

In some embodiments, the ASIC fabric may be laid-out in a vertical stripe across the FPGA fabric. In this configuration, it may be preferable that ASIC fabric match the pitch of the FPGA fabric in the vertical direction to simplify the interconnectivity between the ASIC fabric and the FPGA fabric. Pitch-matching may not be required in the horizontal direction because the vertical stripe can span most of the vertical length of the FPGA, eliminating or greatly reducing the amount of interconnectivity required in this direction. Other configurations of the ASIC fabric can also be used such as horizontal stripes or rectangular regions. It may be preferable to pitch-match the ASIC fabric and the FPGA fabric in these other configurations in one or both directions.

Additionally, in order to ensure proper interconnection to, from, and/or through the ASIC fabric, the metal assignments between the FPGA fabric and ASIC fabric must be compatible. In some embodiments, portions of metal layers within the custom region can be reserved for routing lines from the FPGA fabric. In some embodiments, metal feedthrus are incorporated within the custom region to ensure sufficient routing through the ASIC fabric. In yet other embodiments, portions of the routing lines may be incorporated as part of the design definition of the custom region itself.

Further features of the invention, its nature and various advantages, will be more apparent from the accompanying drawings and the following detailed description.

DETAILED DESCRIPTION

Figure 1:
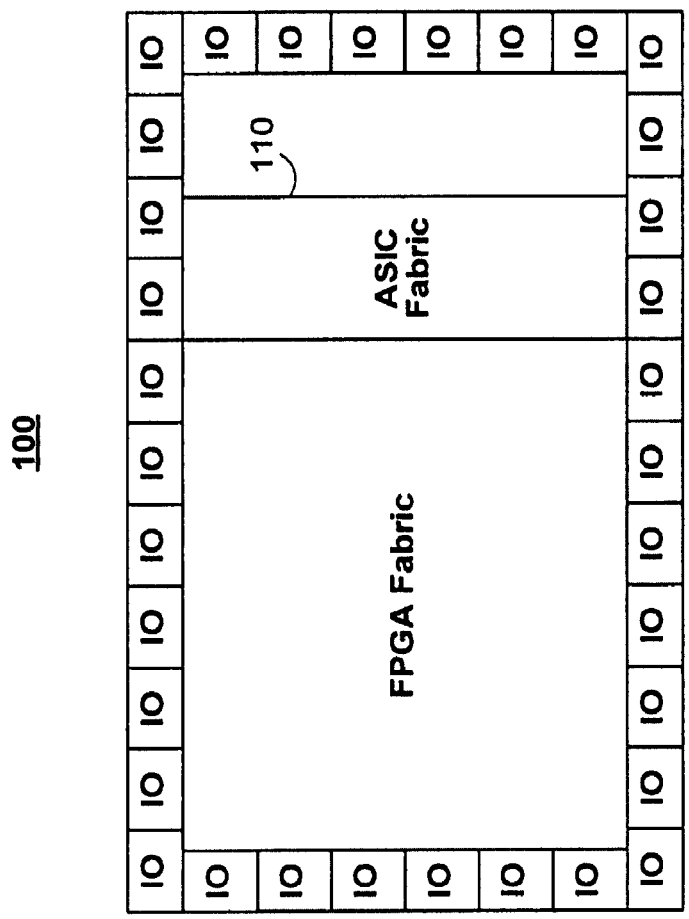
FIG. 1 is a simplified diagram of an FPGA with integrated ASIC fabric in accordance with the invention.

FIG. 1 shows a simplified illustration of FPGA 100 which includes a ASIC fabric 110. One or more custom or semi-custom designs can be instantiated within ASIC fabric 110. ASIC fabric 110, as well as the designs incorporated therein, can be integrated with the FPGA fabric to communicate with the rest of FPGA 100.

Preferably, ASIC fabric 110 can be constructed within the FPGA fabric in the same manner as a memory, DSP, or other hard block. For simplicity of discussion, it is assumed that ASIC fabric 110 is a vertical stripe in the FPGA, similar to typical DSP or memory stripes. This is not a requirement. ASIC fabric could be any suitable shape or size such as a horizontal stripe or rectangular or other region. With the example of a vertical stripe comes the assumption that the logic is preferably pitch-matched in some way in the vertical dimension, but is generally unconstrained in the horizontal direction. In other words, when configured as a vertical stripe, ASIC fabric 110 may receive inputs and provide outputs via horizontal interconnect wires (not shown) that run across the surface of FPGA 100. Pitch-matching the vertical stripe in the vertical dimension can simplify the process of connecting ASIC fabric 110 to these horizontal wires. Similarly, it can also be seen that if a vertical stripe of ASIC fabric 110 spans the entire vertical dimension of FPGA 100, vertical interconnect wires will probably not cross ASIC fabric 110 eliminating any substantial need for horizontal pitch matching.

Figure 2:
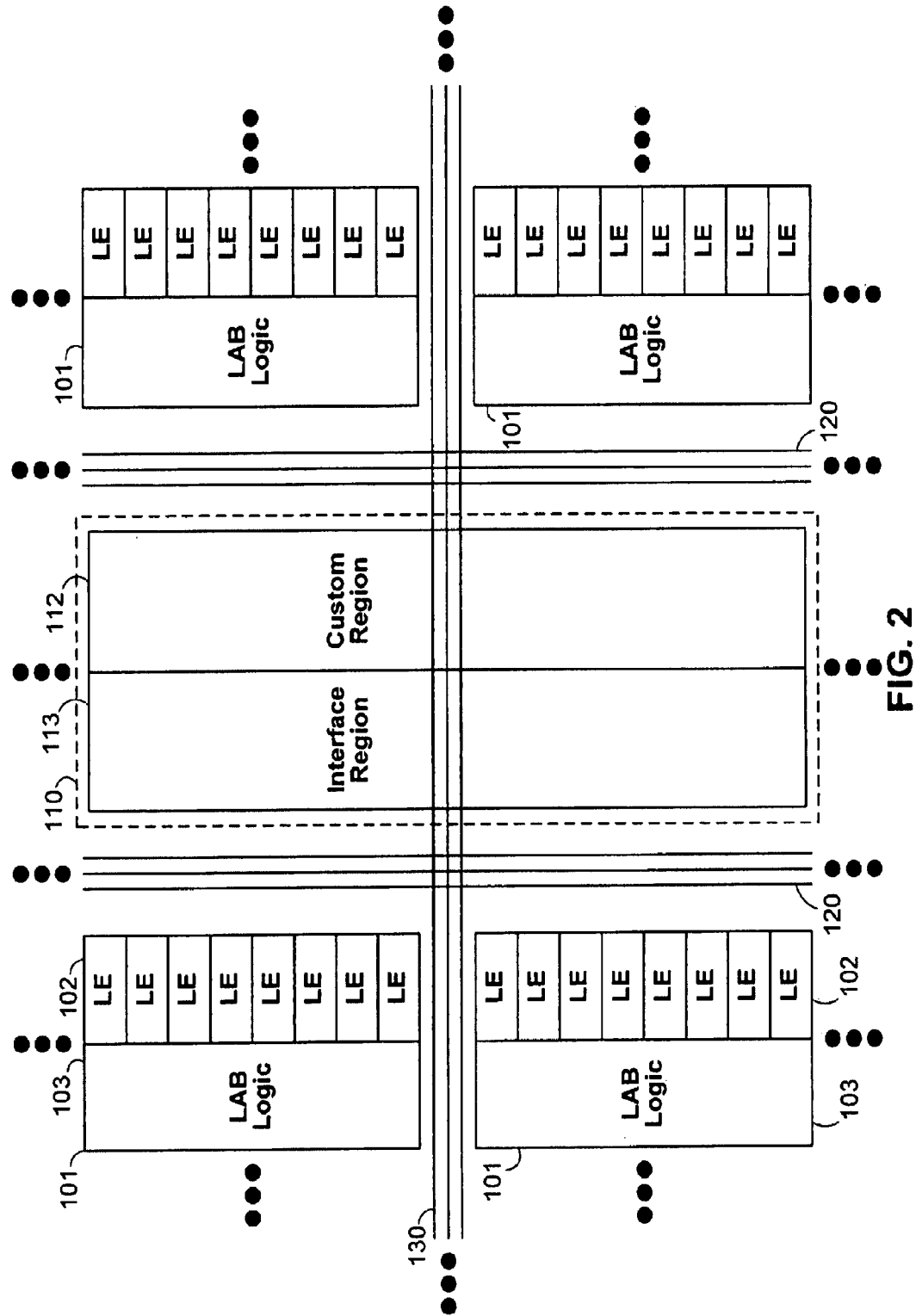
FIG. 2 is a more detailed (but still simplified) diagram of a portion of an illustrative embodiment of FIG. 1.

FIG. 2 shows a more detailed (but still simplified) portion of a FPGA including ASIC fabric 110, LABS 101, and interconnect lines 120 and 130. As described above, the FPGA is made up of a large number of relatively small LEs which are clustered together within LABs such as LABs 101.

LABs 101 also include LAB logic 103 which typically includes programmable interconnection circuitry for conveying signals to, from, and/or between the LEs in any of many different ways. Further, LAB logic 103 also includes programmable interconnection circuitry for conveying signals to, from, and/or between LABS 101 in any of many different ways. The LAB interconnections can be made over vertical lines 120, horizontal lines 130, and other local interconnections (not shown).

ASIC fabric 110 includes interface region 113 and custom region 112. Interface region 113 can provide the same or similar functionality for ASIC fabric 110 as LAB logic 103 provides for LABs 101. Namely, interface region 113 provides the interconnections to, from, and/or between the other portions of the FPGA. Thus, interface region 113 provides a standard interface between ASIC fabric 110 and LABs 101 irrespective of the specific design implemented within custom region 112. Interface region 113 may include, for example, LIM and LEIM muxes that connect to physical input ports of custom region 112 and DIM muxes that connect to output ports of custom region 112.

Custom region 112 is the area of ASIC fabric 110 that can be customized to implement specific ASIC designs within the FPGA. One approach for custom region 112 employs a structured ASIC architecture having the same basic organization of LEs as a typical FPGA. For example, if the FPGA includes an array of LEs, each of which has a four-input LUT ("4-LUT") and a register, then the structured ASIC has a similar array of LEs including 4-LUTs and registers. Certain layers in the ASIC are then customized to a particular user's design to effectively "program" the LEs and to provide the required interconnection routing among the LEs. These customizable layers are therefore the only portions that need to be customized to modify the functionality of custom region 112.

In some other embodiments, custom region 112 can include logic elements that are not the same as the LEs in an equivalent FPGA. These logic elements are referred to herein as hybrid LES. Each hybrid LE may include a relatively small, general-purpose, combinatorial logic component (e.g., a one-input LUT or "1-LUT"), a relatively small array of logic gates (e.g., two two-input NAND gates), and some associated interconnection or routing resources. The amount of operational circuitry in a hybrid LE (e.g., the 1-LUT and the NAND gates) is much less than the amount of operational circuitry in a related FPGA LE. At least some aspects of the routing resources in a hybrid LE are programmable (e.g., mask programmable using vias) for such purposes as making input connections to the hybrid LE, output connections from the hybrid LE, and internal connections within the hybrid LE. For some relatively under-utilized FPGA LEs, one ASIC hybrid LE can perform the functions of the LE. If an LE has greater utilization, then several adjacent (or at least nearby) hybrid LEs may be needed to equivalently perform the LE's functions. The routing resources of hybrid LEs facilitate interconnecting adjacent (or nearby) hybrid LEs that need to be put together to perform any LE's functions. In any case, only as many hybrid LEs as are necessary to perform an LE's functions are used to provide an equivalent of that LE. This is a significant ASIC size reduction as compared to an ASIC that uses a fully featured LE for each FPGA LE.

Further details about structured ASIC implementations that can be used within custom region 112 are explained in more detail in such references as Chua et al. U.S. patent application publication 2006/0001444 and Schleicher et al. U.S. patent application publication Ser. No. 11/050,607, filed Feb. 3, 2005, which are hereby incorporated by reference herein in their entireties.

Figure 3:
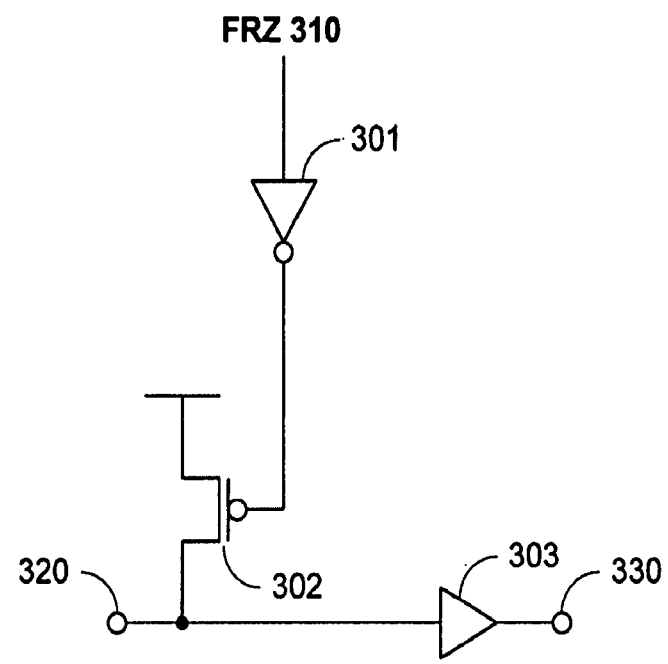
FIG. 3 is a simplified schematic diagram of freeze circuitry in accordance with the invention.

FIG. 3 shows illustrative freeze circuitry 300 that can be incorporated into ASIC fabric 110 (FIG. 1) in accordance with some embodiments of the inventions. Freeze circuitry 300 includes control signal FRZ 310, inverter 301, PMOS 302, buffer 303, input 320, and output 330. Whenever control signal FRZ 310 is asserted, PMOS 302 is activated, which pulls input 320 to a high voltage level and prevents an input signal coupled to input 320 from propagating through buffer 303 to output 330.

Freeze circuitry 300 or any other suitable circuitry can be inserted within ASIC fabric 110, at each of the inputs of the custom portion of ASIC fabric 110 to allow the inputs be held (frozen) high. This freeze circuitry can prevent extraneous signals from propagating through to the inputs of the custom region during programming of the programmable portion of the FPGA. Similar freeze logic can also be inserted on the output side of the custom portion of ASIC fabric 110.

Figure 4:
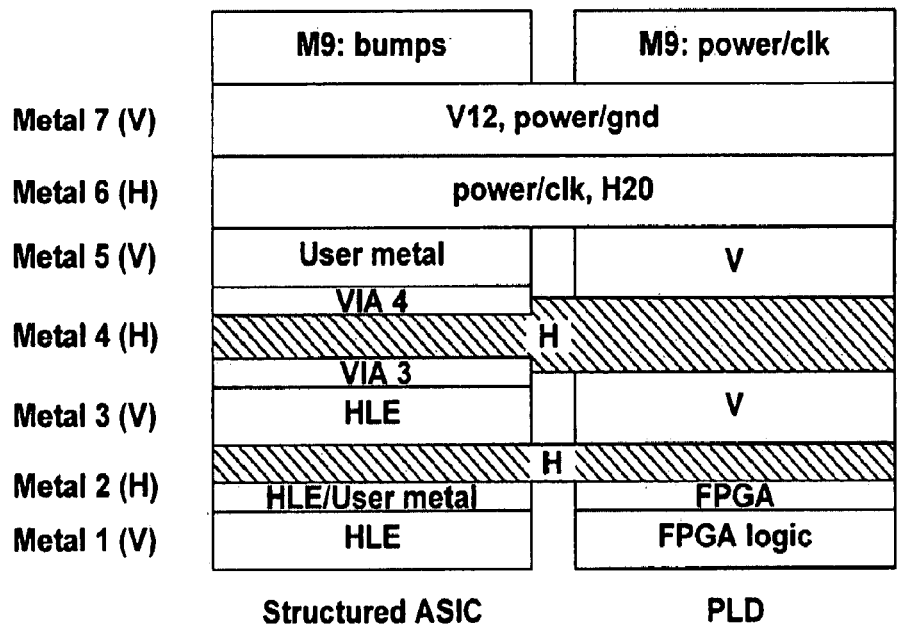
FIG. 4 is a simplified diagram of metal assignments within the FPGA and ASIC fabrics in accordance with the invention.

FIG. 4 shows an illustrative diagram of a portion of the metal layer assignments of the FPGA fabric region, the ASIC fabric, and the interconnections there between. The metal assignments between the two fabrics must be compatible, such that the FPGA routing lines (e.g., horizontal lines 120 and vertical lines 130 (FIG. 2)) can be routed to, from, and/or through the ASIC fabric, and to ensure that the chip can be programmed as an FPGA after fabrication of the device once the custom region instantiated. For example, if approximately 80% of the Metal-4 layer in the FPGA is allocated for horizontal routing lines, then a consistent routing fabric may also require that approximately 80% of the Metal-4 layer in the custom fabric is reserved. Failure to allocate the metal layers in this manner may create routing blockages in the combined chip.

In the embodiment illustrated in FIG. 1, where ASIC fabric 110 takes the form of a vertical stripe, the routing of vertical routing lines (not shown) are more flexible than the routing of horizontal lines (not shown). This is because the vertical routing within the custom region can be done entirely within ASIC fabric 110 and there are no portions of the FPGA fabric above or below ASIC fabric which would require such vertical routing to, from, and/or through the ASIC fabric. It should be understood, however, that ASIC fabric may be designed in any number of configuration, including horizontal stripes and rectangular regions, and that the metal layer requirements for routing signals throughout the ASIC fabric as well as between the ASIC fabric and the FPGA fabric may depend on the size and shape of the ASIC fabric region.

Returning to FIG. 4, it can be seen that the Metal-5 and Metal-3 layers are allocated primarily for vertical routing within the FPGA fabric regions, but that within the ASIC fabric region, the Metal-5 layer is allocated primarily to user metal (i.e., to create the custom designs) and the Metal-3 layer is allocated to the logic elements of the structured ASIC. Note that the interface region of ASIC fabric may continue to have vertical routing lines like the rest of the FPGA fabric regions, so the ASIC fabric would continue to have some vertical routing in the Metal-5 and Metal-3 layers. Within the FPGA fabric region the Metal-4 layer is allocated primarily for horizontal routing and half of the Metal-2 layer is allocated primarily for FPGA logic (i.e. to create the LEs and other blocks). Within the ASIC fabric region, half of the Metal-4 and Metal-2 layers can be allocated primarily for horizontal routing, leaving the other halves of the Metal-4 and the Metal-2 layers for user metal and for the logic elements of the structured ASIC, respectively. Thus, by allocating particular portions of the metal layers of the ASIC fabric region to route FPGA signals, it is possible to ensure that there are sufficient routing resourced available irrespective of the custom design implemented with the ASIC fabric. It should be understood that this metal allocation is merely illustrative and that any other suitable metal allocations may be used.

It is possible in the present configuration (i.e., a vertical stripe configuration) or in other configurations that insufficient metal exists to provide horizontal or vertical routing resources within the custom region, even after these routing resources are moved or shared amongst different metal layers. In these instances, space for more routing lines can be created by making the ASIC fabric larger, or by adding feedthru regions within the ASIC fabric.

Figure 5:
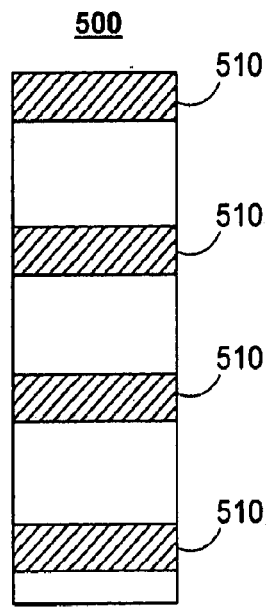
FIG. 5 is a simplified diagram of ASIC fabric including feedthru regions in accordance with the invention.

FIG. 5 shows an illustrative vertical stripe 500 of ASIC fabric having integrated feedthru regions 510 within the ASIC fabric. These feedthru regions 510 can be areas within ASIC fabric primarily allocated to routing lines and resources. Feedthru regions 510 may be distributed uniformly throughout the ASIC fabric as shown, or can be based on the actual amount of metal required to facilitate sufficient routing.

In some embodiments, it may be possible to reserve sufficient amounts of metal within the ASIC fabric without allocating specific proportions of the metal layers (e.g., as described above with respect to FIG. 4) or without allocating specific feedthrough regions (e.g., as described above with respect to FIG. 5). Instead, portions of the routing lines may be incorporated as part of the definition of the custom region itself. For example, it could be part of the custom design to provide additional horizontal feedthrus built out of the ASIC fabric.

In some embodiments, ASIC fabric 110 (FIG. 1) can be used to provide greater flexibility in designing FPGA families. For example, ASIC fabric 110 may be used for either additional memories or DSP blocks. Consider a FPGA design including one DSP column (not shown), one memory column (not shown), in addition to ASIC fabric 110. In an initial "default" implementation, the device can be customized to implement a second memory column using ASIC fabric 110. However, because the design implemented by ASIC fabric 110 can be replaced with another design, a DSP-rich device can be produced in which ASIC fabric 110 originally implementing memory is re-populated with DSP blocks.

In another embodiment, ASIC fabric 110 containing generic DSP blocks may be replaced with a set of domain-specific functions which may be used by different markets. These domain-specific functions include, for example, crossbars and barrel shifters, floating-point units, content-addressable memories, sets of shift-registers, microprocessors, or a combination thereof determined by market needs.

The flexibly provided by ASIC fabric 110 allows FPGA 100 to be manufactured a default ASIC fabric 110 design without pre-defining the contents of any future variations ASIC fabric 110. Thus the definition of ASIC fabric 110 is divorced from the critical path of manufacturing the FPGA device. Furthermore, designs implemented in ASIC fabric 110 can be changed relatively easily (e.g. requiring only two metal layer and two via mask changes), thus a device variant can be generated quickly and inexpensively. Thus, unlike with typical FPGA designs, a full mask-set is not required for each for each variant.

In some other embodiments, software design tools and pre-defined libraries can be used to simplify the design of ASIC fabric 110. For example, an FPGA design in accordance with the invention may include video processing functionality incorporated into ASIC fabric 110. Video processing libraries can compile functions from the video and image-processing intellectual property ("IP") library into ASIC fabric 110. Furthermore, many types of "pre-verified IP" blocks can be implemented within ASIC fabric 110. A set of pre-verified IP "cells" can be selected for incorporation into ASIC fabric 110.

In some embodiments, portions of the custom region can be programmable. In these embodiments, a strip of configuration SRAM can be implemented beside the custom region or even within the custom region itself. The configuration SRAM may allow portions of the custom region to be programmable, by sourcing bits from the SRAM as a control signal.

Figure 6:
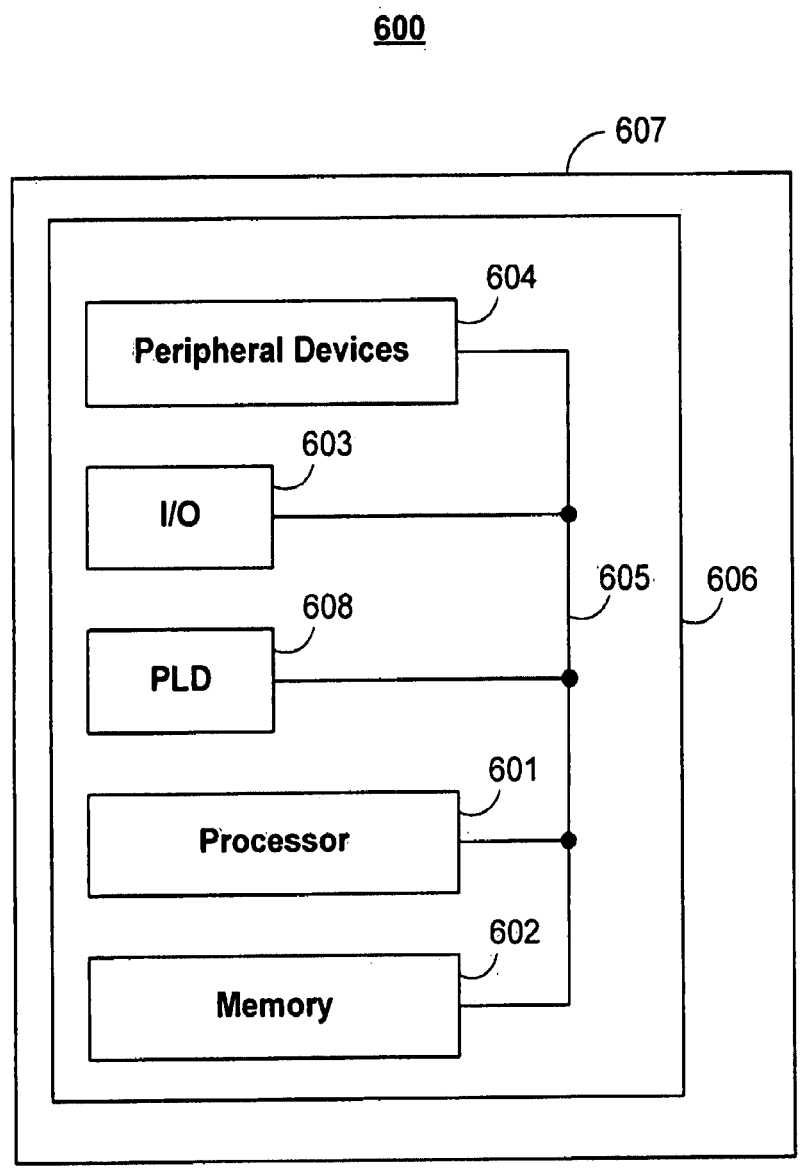
FIG. 6 is a simplified block diagram of an illustrative system employing an FPGA with integrated ASIC fabric in accordance with the present invention.

A FPGA 60 incorporating the present invention may be used in many kinds of electronic devices. One possible use is in a data processing system 600 shown in FIG. 6. Data processing system 600 may include one or more of the following components: a processor 601; memory 602; I/O circuitry 603; and peripheral devices 604. These components are coupled together by a system bus 605 and are populated on a circuit board 606 which is contained in an end-user system 607.

System 600 can be used in a wide variety of applications, such as computer networking, data networking, instrumentation, video processing, digital signal processing, or any other application where the advantage of using programmable or reprogrammable logic is desirable. FPGA 60 can be used to perform a variety of different logic functions. For example, FPGA 60 can be configured as a processor or controller that works in cooperation with processor 601. FPGA 60 may also be used as an arbiter for arbitrating access to shared resources in system 600. In yet another example, FPGA 60 can be configured as an interface between processor 601 and one of the other components in system 600. It should be noted that system 600 is only exemplary, and that the true scope and spirit of the invention should be indicated by the following claims.

Various technologies can be used to implement FPGAs 60 as described above and incorporating this invention.

It will be understood that the foregoing is only illustrative of the principles of the invention, and that various modifications can be made by those skilled in the art without departing from the scope and spirit of the invention. For example, the numbers of various components included in the embodiments shown and described herein can be increased or decreased if desired.

The invention claimed is:

1. A field programmable gate array ("FPGA") having integrated structured application specific integrated circuit ("ASIC") fabric, said FPGA comprising:
   an FPGA fabric region comprising a plurality of logic elements ("LEs") programmably coupled together to form a logic array block ("LAB");
   a custom region of the structured ASIC fabric comprising:
      a plurality of hybrid LEs ("HLEs"), wherein each HLE of the plurality of HLEs has less operational circuitry than each LE of the plurality of LEs; and
      an user metal region comprising programmable routing resources for the plurality of HLEs; and
   an interface region operable to couple said LAB and said custom region, wherein the interface region comprises freeze logic circuitry operable to freeze inputs of the custom region, and
   wherein the FPGA comprises a plurality of metal layers, wherein a first metal layer of the plurality of metal layers spans the FPGA fabric region and the custom region;
   and wherein portion of the first metal layer located in the custom region is allocated for routing signals from the LAB across the structured ASIC fabric.

2. The FPGA of claim 1, wherein the interface region uses an interface standard to provide signals to the custom region that is the same as the interface standard used to provide signals to the LAB.

3. The FPGA of claim 2, wherein the freeze logic circuitry is operable to, when activated, provide a fixed voltage level that prevent signals from the FPGA from being transmitted to the plurality of HLEs of the custom region.

4. The FPGA of claim 1, wherein the structured ASIC fabric comprises a stripe in a first direction, wherein the stripe spans the FPGA.

5. The FPGA of claim 4, wherein the stripe is pitch-matched with the FPGA fabric region along the first direction.

6. The FPGA of claim 1, wherein the custom region comprises at least one feedthru region.

7. A method for integrating structured application specific integrated circuit ("ASIC") fabric within a field programmable gate array ("FPGA"), the method comprising:
   incorporating said structured ASIC fabric into FPGA fabric, wherein the structured ASIC fabric comprises an interface region and a custom region; and
   coupling the custom region with the FPGA fabric using the interface region, wherein the interface region comprises freeze logic circuitry operable to, when activated, set inputs of the custom region to a fixed value, and wherein the FPGA comprises a plurality of metal layers, wherein a portion of a metal layer from said plurality of metal layers is allocated for routing signals from the FPGA fabric across the structured ASIC fabric.

8. The method of claim 7, further comprising implementing a structured ASIC design within the custom region.

9. The method of claim 8, wherein implementing the structured ASIC design comprises selecting the structured ASIC from a pre-verified library of designs.

10. The method of claim 7, further comprising preventing signals from the FPGA fabric from coupling to the custom region, during programming of the FPGA fabric, by freezing the interface region using the freeze logic circuitry.

11. The method of claim 7, further comprising routing at least a signal from the FPGA fabric through the structured ASIC fabric.

12. The method of claim 7, comprising:
   programming the custom region by a implementing a user metal that forms connections between logic elements of the custom region.

13. A method for integrating a field programmable gate array ("FPGA") with an integrated structured application specific integrated circuit ("ASIC") fabric comprising:
   programmably coupling together a plurality of logic elements ("LEs") to form a logic array block ("LAB");
   coupling together a plurality of hybrid LEs to form a custom region of the ASIC fabric, wherein each hybrid LE has less operational circuitry than each LE of the plurality of LEs; and
   coupling said LAB and said custom region using an interface region, wherein the interface region comprises freeze logic circuitry operable to freeze inputs of the custom region, and wherein the FPGA comprises a plurality of metal layers, a first metal layer of the plurality of metal layers spans the custom region and FPGA region, and a portion of the first metal layer is allocated for routing signals from the LAB across the structured ASIC fabric.

14. The method of claim 13, wherein the interface region uses an interface standard to provide signals to the custom region that is the same as the interface standard used to provide signals to the LAB.

15. The method of claim 14, wherein the freeze logic circuitry is operable to, when activated, providing a fixed voltage level that prevent signals from the FPGA from being transmitted to the plurality of hybrid LEs of the custom region.

16. The method of claim 13, wherein the structured ASIC fabric comprises a stripe in a first direction, wherein the stripe spans the FPGA.

17. The method of claim 16, wherein the stripe is pitch-matched with the FPGA region along the first direction.

18. The method of claim 13, wherein the custom region comprises at least one feedthru region.

* * * * *